United States Patent
Wang et al.

(10) Patent No.: US 8,756,478 B2
(45) Date of Patent: *Jun. 17, 2014

(54) MULTI-LEVEL LDPC LAYER DECODER

(75) Inventors: Chung-Li Wang, San Jose, CA (US); Zongwang Li, Santa Clara, CA (US); Lei Chen, Santa Clara, CA (US); Johnson Yen, Fremont, CA (US)

(73) Assignee: LSI Corporation, Milpitas, CA (US)

( * ) Notice: Subject to any disclaimer, the term of this patent is extended or adjusted under 35 U.S.C. 154(b) by 215 days.

This patent is subject to a terminal disclaimer.

(21) Appl. No.: 13/300,078

(22) Filed: Nov. 18, 2011

(65) Prior Publication Data

US 2013/0061107 A1 Mar. 7, 2013

Related U.S. Application Data

(63) Continuation-in-part of application No. 13/227,416, filed on Sep. 7, 2011.

(51) Int. Cl.
*H03M 13/00* (2006.01)

(52) U.S. Cl.
USPC .......................................... 714/758; 714/780

(58) Field of Classification Search
CPC .......... H03M 13/1131; H03M 13/096; H03M 13/1102
USPC .................................................. 714/758, 780
See application file for complete search history.

(56) References Cited

U.S. PATENT DOCUMENTS

| | | | |
|---|---|---|---|
| 5,278,703 A | 1/1994 | Rub et al. | |
| 5,278,846 A | 1/1994 | Okayama | |
| 5,317,472 A | 5/1994 | Schweitzer, III | |
| 5,325,402 A | 6/1994 | Ushirokawa | |
| 5,392,299 A | 2/1995 | Rhines | |
| 5,417,500 A | 5/1995 | Martinie | |
| 5,513,192 A | 4/1996 | Janku | |
| 5,523,903 A | 6/1996 | Hetzler | |
| 5,550,810 A | 8/1996 | Monogioudis et al. | |
| 5,550,870 A | 8/1996 | Blaker | |
| 5,612,964 A | 3/1997 | Haraszti | |
| 5,710,784 A | 1/1998 | Kindred | |
| 5,717,706 A | 2/1998 | Ikeda | |

(Continued)

OTHER PUBLICATIONS

Axvig et al., "Average Min-Sum Decoding of LDPC Codes", 5th International Symposium on Turbo Codes and Related Topics (2008).

(Continued)

*Primary Examiner* — M. Mujtaba K Chaudry
(74) *Attorney, Agent, or Firm* — Hamilton DeSanctis & Cha

(57) ABSTRACT

Various embodiments of the present invention are related to methods and apparatuses for decoding data, and more particularly to methods and apparatuses for multi-level layered LDPC decoding. For example, in one embodiment an apparatus includes a variable node processor and a check node processor. The variable node processor is operable to generate variable node to check node messages and to calculate perceived values based on check node to variable node messages. The check node processor is operable to generate the check node to variable node messages and to calculate checksums based on variable node to check node messages. The check node processor includes a min finder circuit operable to identify a minimum, a next minimum and an index of minimum value in the variable node to check node messages. The variable node processor and check node processor are operable to perform layered multi-level decoding.

20 Claims, 6 Drawing Sheets

(56) References Cited

U.S. PATENT DOCUMENTS

| | | |
|---|---|---|
| 5,802,118 A | 9/1998 | Bliss |
| 5,844,945 A | 12/1998 | Nam |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | McCalissister |
| 6,023,783 A | 2/2000 | Divsalar |
| 6,029,264 A | 2/2000 | Kobayashi |
| 6,065,149 A | 5/2000 | Yamanaka |
| 6,097,764 A | 8/2000 | McCallister |
| 6,145,110 A | 11/2000 | Khayrallah |
| 6,216,249 B1 | 4/2001 | Bliss |
| 6,216,251 B1 | 4/2001 | McGinn |
| 6,266,795 B1 | 7/2001 | Wei |
| 6,317,472 B1 | 11/2001 | Choi |
| 6,351,832 B1 | 2/2002 | Wei |
| 6,377,610 B1 | 4/2002 | Hagenauer |
| 6,381,726 B1 | 4/2002 | Weng |
| 6,473,878 B1 | 10/2002 | Wei |
| 6,535,553 B1 | 3/2003 | Limberg et al. |
| 6,625,775 B1 | 9/2003 | Kim |
| 6,633,856 B2 * | 10/2003 | Richardson et al. ............ 706/15 |
| 6,748,034 B2 | 6/2004 | Hattori |
| 6,757,862 B1 | 6/2004 | Marianetti, II |
| 6,785,863 B2 | 8/2004 | Blankenship |
| 6,789,227 B2 * | 9/2004 | De Souza et al. ............ 714/804 |
| 6,810,502 B2 | 10/2004 | Eidson |
| 6,895,547 B2 * | 5/2005 | Eleftheriou et al. .......... 714/801 |
| 6,970,511 B1 | 11/2005 | Barnette |
| 6,986,098 B2 | 1/2006 | Poeppelman |
| 7,047,474 B2 | 5/2006 | Rhee |
| 7,058,873 B2 | 6/2006 | Song |
| 7,073,118 B2 | 7/2006 | Greenberg |
| 7,093,179 B2 | 8/2006 | Shea |
| 7,117,427 B2 | 10/2006 | Ophir |
| 7,133,228 B2 | 11/2006 | Fung |
| 7,184,486 B1 | 2/2007 | Wu |
| 7,191,378 B2 | 3/2007 | Eroz |
| 7,203,887 B2 | 4/2007 | Eroz |
| 7,308,061 B1 | 12/2007 | Huang |
| 7,310,768 B2 | 12/2007 | Eidson |
| 7,313,750 B1 | 12/2007 | Feng |
| 7,370,258 B2 | 5/2008 | Iancu |
| 7,415,651 B2 | 8/2008 | Argon |
| 7,502,189 B2 | 3/2009 | Sawaguchi |
| 7,523,375 B2 | 4/2009 | Spencer |
| 7,587,657 B2 | 9/2009 | Haratsch |
| 7,590,168 B2 | 9/2009 | Raghavan |
| 7,646,829 B2 | 1/2010 | Ashley |
| 7,702,986 B2 | 4/2010 | Bjerke |
| 7,752,523 B1 | 7/2010 | Chaichanavong |
| 7,779,325 B2 | 8/2010 | Song |
| 7,802,172 B2 | 9/2010 | Casado |
| 7,952,824 B2 | 5/2011 | Dziak |
| 7,958,425 B2 | 6/2011 | Chugg |
| 7,996,746 B2 | 8/2011 | Livshitz |
| 8,018,360 B2 | 9/2011 | Nayak |
| 8,201,051 B2 | 6/2012 | Tan |
| 8,237,597 B2 | 8/2012 | Liu |
| 8,261,171 B2 | 9/2012 | Annampedu |
| 8,291,284 B2 | 10/2012 | Savin |
| 8,295,001 B2 | 10/2012 | Liu |
| 2004/0034828 A1 * | 2/2004 | Hocevar ...................... 714/800 |
| 2008/0069373 A1 | 3/2008 | Jiang |
| 2008/0304558 A1 | 12/2008 | Zhu |
| 2009/0132893 A1 | 5/2009 | Miyazaki |
| 2009/0185643 A1 | 7/2009 | Fitzpatrick |
| 2010/0211841 A1 * | 8/2010 | Cao et al. ...................... 714/748 |
| 2011/0167227 A1 | 7/2011 | Yang |
| 2011/0252294 A1 * | 10/2011 | Ng et al. ........................ 714/804 |
| 2011/0264987 A1 | 10/2011 | Li |
| 2012/0124118 A1 | 5/2012 | Ivkovic |
| 2012/0182643 A1 | 7/2012 | Zhang |
| 2012/0212849 A1 | 8/2012 | Xu |
| 2012/0262814 A1 | 10/2012 | Li |
| 2012/0265488 A1 | 10/2012 | Sun |

OTHER PUBLICATIONS

Bahl et al., "Optimal decoding of linear codes for minimizing symbol error rate", IEEE Trans. Inform. Theory, vol. 20, pp. 284-287 (Mar. 1974).

Blaum, "High-Rate Modulation Codes for Reverse Concatenation", IEEE Transactions on Magnetics, vol. 43, No. 2 (Feb. 2007).

Casado et al., Multiple-rate low- density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Shokrollahi "LDPC Codes: An Introduction", Digital Fountain, Inc. (Apr. 2, 2003).

Spagnol et al, "Hardware Implementation of GF($2^{\wedge}$ m) LDPC Decoders", IEEE Transactions on Circuits and SystemssI: Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/269,832, Unpublished (filed Oct. 10, 2011) (Haitao Xia).

U.S. Appl. No. 13/113,219, Unpublished (filed May 23, 2011) (Yang Han).

U.S. Appl. No. 13/227,544, Unpublished (filed Sep. 8, 2011) (Shaohua Yang).

U.S. Appl. No. 13/283,549, Unpublished (filed Oct. 27, 2011) (Wu Chang).

(56) References Cited

OTHER PUBLICATIONS

U.S. Appl. No. 13/269,852, Unpublished (filed Oct. 10, 2011) (Haitao Xia).
U.S. Appl. No. 13/284,767, Unpublished (filed Oct. 28, 2011) (Fan Zhang).
U.S. Appl. No. 13/174,453, Unpublished (filed Jun. 30, 2011) (Johnson Yen).
U.S. Appl. No. 13/174,537, Unpublished (filed Jun. 30, 2011) (Anantha Raman Krishnan).
U.S. Appl. No. 13/180,495, Unpublished (filed Jul. 11, 2011) (Chung-Li Wang).
U.S. Appl. No. 13/296,022, Unpublished (filed Nov. 14, 2011) (Victor Krachkovsky).
U.S. Appl. No. 13/213,751, Unpublished (filed Aug. 19, 2011) (Fan Zhang).
U.S. Appl. No. 13/227,416, Unpublished (filed Sep. 7, 2011) (Lei Chen).
U.S. Appl. No. 13/171,615, Unpublished (filed Jun. 29, 2011) (Bradley D. Seago).
U.S. Appl. No. 13/239,683, Unpublished (filed Sep. 22, 2011) (Changyou Xu).
U.S. Appl. No. 13/295,150, Unpublished (filed Nov. 14, 2011) (Zongwang Li).
U.S. Appl. No. 13/284,730, Unpublished (filed Oct. 28, 2011) (Fan Zhang).
U.S. Appl. No. 13/186,234, Unpublished (filed Jul. 19, 2011) (Haitao Xia).
Vasic, B., "High-Rate Girth-Eight Codes on Rectangular Integer Lattices", IEEE Trans. Communications, vol. 52, Aug. 2004, pp. 1248-1252.
Vasic, B., "High-Rate Low-Density Parity-Check Codes Based on Anti-Pasch Affine Geometries," Proc ICC 2002, pp. 1332-1336.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Yeo et al., "VLSI Architecture for Iterative Decoders in Magnetic Storage Channels", Mar. 2001, pp. 748-55, IEEE trans. Magnetics, vol. 37, No. 2.
Zhang et al., "Analysis of Verification-Based Decoding on the q-ary Symmetric Channel for Large q", IEEE Trans. on Information Theory, vol. 57, No. 10 (Oct. 2011).
Zhong et al., "High-Rate Quasi-Cyclic LDPC Codes for Magnetic Recording Channel with Low Error Floor", ISCAS, IEEE pp. 3546-3549, May 2006.
Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.
Zhong et al., "Joint Code-Encoder Design for LDPC Coding System VLSI Implementation", ISCAS, IEEE pp. 389-392, May 2004.
Zhong et al., "Design of VLSI Implementation-Oriented LDPC Codes", IEEE, pp. 670-673, 2003.
Zhong, "Block-LDPC: A Practical LDPC Coding System Design Approach", IEEE Trans. on Circuits, Regular Papers, vol. 5, No. 4, pp. 766-775, Apr. 2005.

* cited by examiner

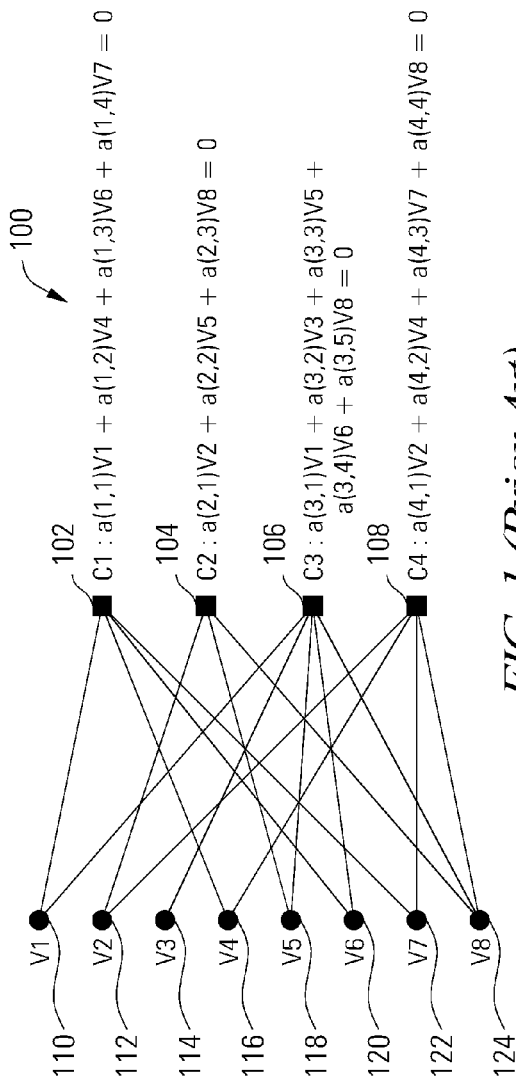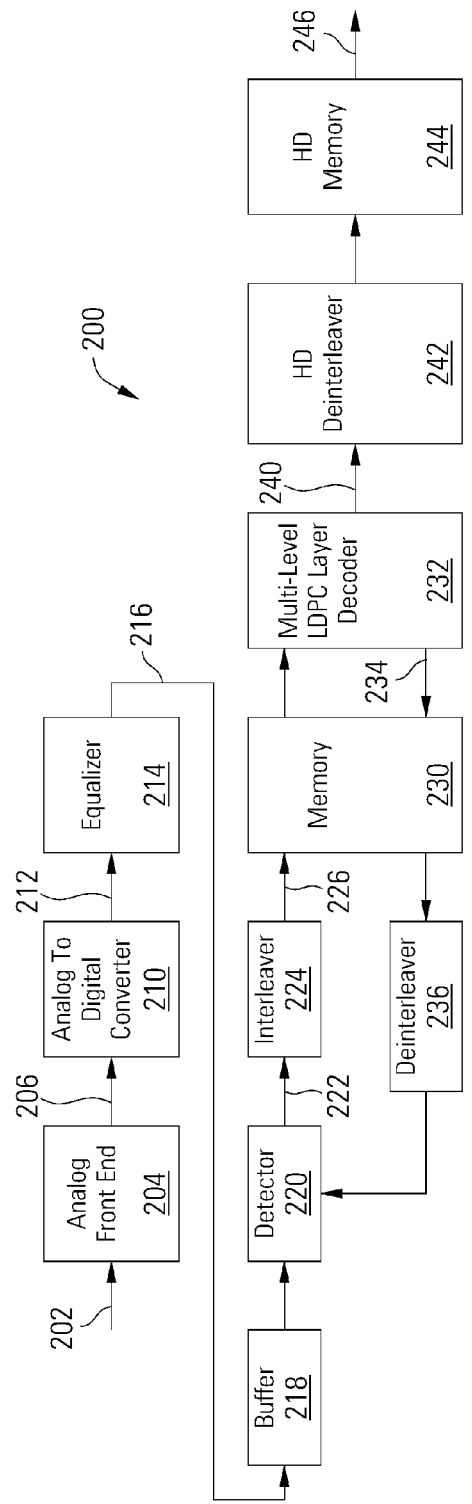

MULTI-LEVEL LDPC LAYER DECODER

CROSS-REFERENCE TO RELATED APPLICATIONS

This application is a continuation-in-part of U.S. patent application Ser. No. 13/227,416 filed on Sep. 11, 2011 for a "Multi-Level LDPC Layer Decoder", which is incorporated by reference herein for all purposes.

BACKGROUND

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of error checking systems have been developed to detect and correct errors in digital data. For example, in perhaps the simplest system, a parity bit can be added to a group of data bits, ensuring that the group of data bits (including the parity bit) has either an even or odd number of ones. When using odd parity, as the data is prepared for storage or transmission, the number of data bits in the group that are set to one are counted, and if there is an even number of ones in the group, the parity bit is set to one to ensure that the group has an odd number of ones. If there is an odd number of ones in the group, the parity bit is set to zero to ensure that the group has an odd number of ones. After the data is retrieved from storage or received from transmission, the parity can again be checked, and if the group has an even parity, at least one error has been introduced in the data. At this simplistic level, some errors can be detected but not corrected.

The parity bit may also be used in error correction systems, including in LDPC decoders. An LDPC code is a parity-based code that can be visually represented in a Tanner graph 100 as illustrated in FIG. 1. In an LDPC decoder, multiple parity checks are performed in a number of check nodes 102, 104, 106 and 108 for a group of variable nodes 110, 112, 114, 116, 118, 120, 122, and 124. The connections (or edges) between variable nodes 110-124 and check nodes 102-108 are selected as the LDPC code is designed, balancing the strength of the code against the complexity of the decoder required to execute the LDPC code as data is obtained. The number and placement of parity bits in the group are selected as the LDPC code is designed. Messages are passed between connected variable nodes 110-124 and check nodes 102-108 in an iterative process, passing beliefs about the values that should appear in variable nodes 110-124 to connected check nodes 102-108. Parity checks are performed in the check nodes 102-108 based on the messages and the results are returned to connected variable nodes 110-124 to update the beliefs if necessary. LDPC decoders may be implemented in binary or non-binary fashion. In a binary LDPC decoder, variable nodes 110-124 contain scalar values based on a group of data and parity bits that are retrieved from a storage device, received by a transmission system or obtained in some other way. Messages in the binary LDPC decoders are scalar values transmitted as plain-likelihood probability values or log-likelihood-ratio (LLR) values representing the probability that the sending variable node contains a particular value. In a non-binary LDPC decoder, variable nodes 110-124 contain symbols from a Galois Field, a finite field $GF(p^k)$ that contains a finite number of elements, characterized by size $p^k$ where p is a prime number and k is a positive integer. Messages in the non-binary LDPC decoders are multi-dimensional vectors, generally either plain-likelihood probability vectors or LLR vectors.

The connections between variable nodes 110-124 and check nodes 102-108 may be presented in matrix form as follows, where columns represent variable nodes, rows represent check nodes, and a random non-zero element a(i,j) from the Galois Field at the intersection of a variable node column and a check node row indicates a connection between that variable node and check node and provides a permutation for messages between that variable node and check node:

$$H = \begin{bmatrix} a(1,1) & 0 & 0 & a(1,2) & 0 & a(1,3) & a(1,4) & 0 \\ 0 & a(2,1) & 0 & 0 & a(2,2) & 0 & 0 & a(2,3) \\ a(3,1) & 0 & a(3,2) & 0 & a(3,3) & a(3,4) & 0 & a(3,5) \\ 0 & a(4,1) & 0 & a(4,2) & 0 & 0 & a(4,3) & a(4,4) \end{bmatrix}$$

By providing multiple check nodes 102-108 for the group of variable nodes 110-124, redundancy in error checking is provided, enabling errors to be corrected as well as detected. Each check node 102-108 performs a parity check on bits or symbols passed as messages from its neighboring (or connected) variable nodes. In the example LDPC code corresponding to the Tanner graph 100 of FIG. 1, check node 102 checks the parity of variable nodes 110, 116, 120 and 122. Values are passed back and forth between connected variable nodes 110-124 and check nodes 102-108 in an iterative process until the LDPC code converges on a value for the group of data and parity bits in the variable nodes 110-124. For example, variable node 110 passes messages to check nodes 102 and 106. Check node 102 passes messages back to variable nodes 110, 116, 120 and 122. The messages between variable nodes 110-124 and check nodes 102-108 are probabilities or beliefs, thus the LDPC decoding algorithm is also referred to as a belief propagation algorithm. Each message from a node represents the probability that a bit or symbol has a certain value based on the current value of the node and on previous messages to the node.

A message from a variable node to any particular neighboring check node is computed using any of a number of algorithms based on the current value of the variable node and the last messages to the variable node from neighboring check nodes, except that the last message from that particular check node is omitted from the calculation to prevent positive feedback. Similarly, a message from a check node to any particular neighboring variable node is computed based on the current value of the check node and the last messages to the check node from neighboring variable nodes, except that the last message from that particular variable node is omitted from the calculation to prevent positive feedback. As iterations are performed in the system, messages pass back and forth between variable nodes 110-124 and check nodes 102-108, with the values in the nodes 102-124 being adjusted based on the messages that are passed, until the values converge and stop changing or until processing is halted.

BRIEF SUMMARY

Various embodiments of the present invention are related to methods and apparatuses for decoding data, and more particularly to methods and apparatuses for multi-level layered LDPC decoding. For example, in one embodiment an apparatus includes a variable node processor and a check node processor. The variable node processor is operable to generate variable node to check node messages and to calculate perceived values based on check node to variable node messages. The check node processor is operable to generate the check node to variable node messages and to calculate checksums based on variable node to check node messages. The check node processor includes a min finder circuit operable to identify a minimum, a next minimum and an index of minimum value in the variable node to check node messages. The variable node processor and check node processor are operable to perform layered multi-level decoding.

In some embodiments, the apparatus is operable to process multiple circulants in parallel.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals may be used throughout several drawings to refer to similar components. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 1 depicts a Tanner graph of an example prior art LDPC code;

FIG. 2 depicts a block diagram of a read channel which may be used to retrieve or receive stored or transmitted data in accordance with various embodiments of the present invention;

DETAILED DESCRIPTION OF THE INVENTION

Figure 3:
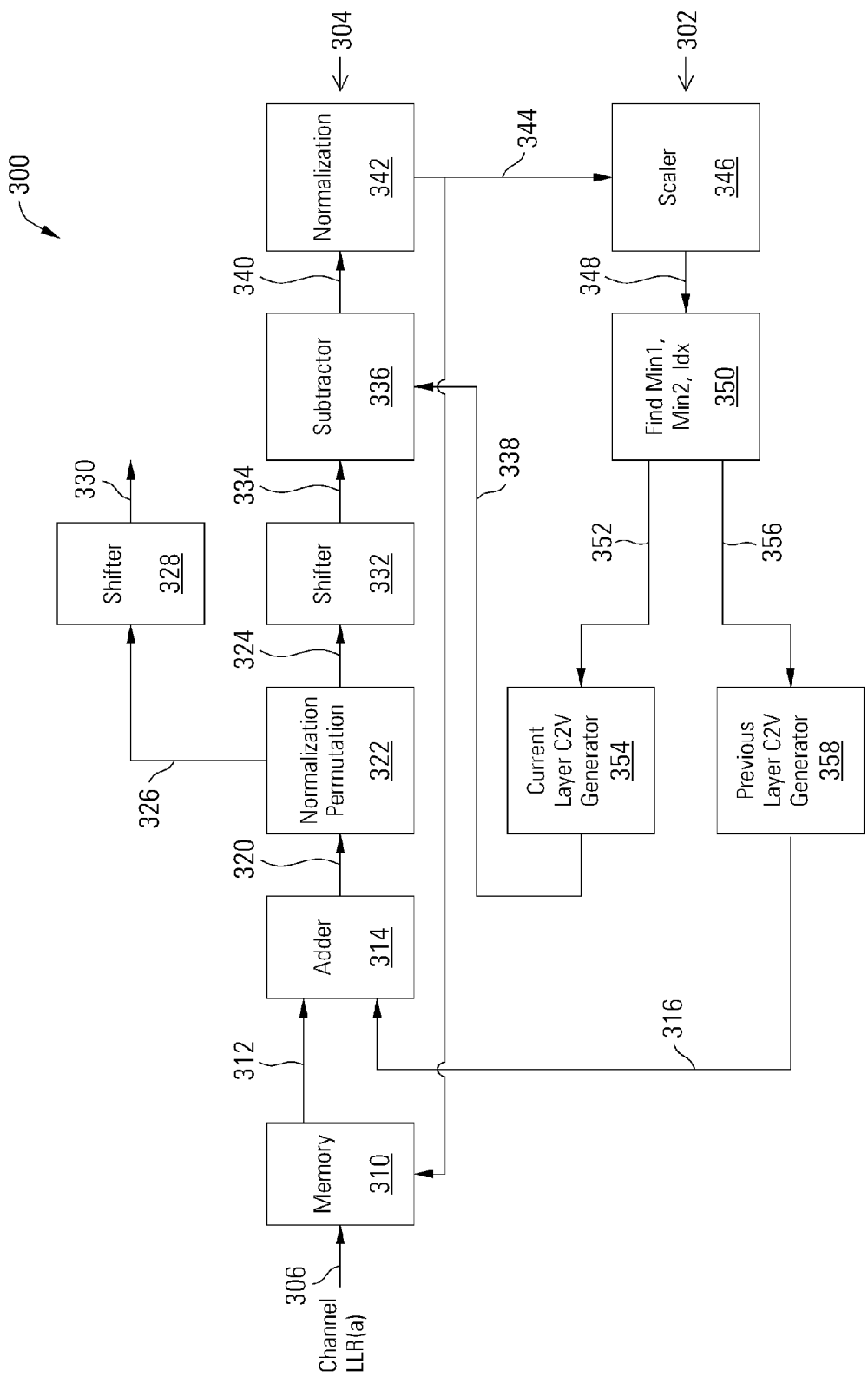
FIG. 3 depicts a block diagram of a multi-level LDPC layer decoder in accordance with various embodiments of the present invention.

Various embodiments of the present invention are related to methods and apparatuses for decoding data, and more particularly to methods and apparatuses for decoding data in a multi-level LDPC layer decoder.

The multi-level LDPC layer decoder performs min-sum based layered decoding of non-binary LDPC codes which provides low-complexity decoding over large Galois Fields and that does not require forward and backward recursions, sorting or dynamic programming. In the min-sum based decoding, also referred to as simplified min-sum decoding, the check nodes calculate the minimum sub-message $min_1(d)$, the index $idx(d)$ of $min_1(d)$, and the sub-minimum or next minimum sub-message $min_2(d)$, or minimum of all sub-messages excluding $min_1(d)$, for each nonzero symbol d in the Galois Field based on all extrinsic V2C messages from neighboring variable nodes. In other words, the sub-messages for a particular symbol d are gathered from messages from all extrinsic inputs, and the $min_1(d)$, $idx(d)$ and $min_2(d)$ is calculated based on the gathered sub-messages for that symbol d. For a Galois Field with q symbols, the check node will calculate the $min_1(d)$, $idx(d)$ and $min_2(d)$ sub-message for each of the q−1 non-zero symbols in the field except the most likely symbol. The $min_1(d)$, $idx(d)$ and $min_2(d)$ values are stored in a memory for use in calculating the C2V message, requiring much less memory than the traditional non-binary LDPC check node processor that stores each intermediate forward and backward message. An example of the simplified min-sum decoding is provided for a multi-level non-layer LDPC decoder in U.S. patent application Ser. No. 13/180,495 filed on Jul. 11, 2011 for a "Min-Sum Based Non-Binary LDPC Decoder", which is incorporated by reference herein for all purposes.

The multi-level LDPC layer decoder uses quasi-cyclic LDPC codes in which the parity check H matrix is an array of circulant sub-matrices, cyclically shifted versions of identity matrices and null matrices with different cyclical shifts. In some embodiments, the H matrix is constructed based on the finite field GF(8) with M circulant rows and N circulant columns, and with each circulant being a b×b sub-matrix with the form:

$$B_{i,j} = \begin{bmatrix} 0 & \alpha^{j_{i,j}} & 0 & \cdots & 0 \\ 0 & 0 & \alpha^{j_{i,j}} & \cdots & 0 \\ \vdots & \vdots & \vdots & \ddots & \vdots \\ 0 & 0 & 0 & \cdots & \alpha^{j_{i,j}} \\ \alpha^{j_{i,j}} & 0 & 0 & \cdots & 0 \end{bmatrix}$$

For example, given a 12×108 H matrix of 48×48 circulants, the overall row length is 108×48 or 5184, and the overall column height is 12×48 or 576. In the multi-level LDPC layer decoder, the parity check H matrix of the LDPC code is partitioned into L layers, with the H matrix being processed row by row and the circulants being processed layer by layer. As the rows are processed, the column results are updated based on each row result. Layered decoding can reduce the time to converge on a result in the decoder in some cases.

Although the multi-level LDPC layer decoder disclosed herein is not limited to any particular application, several examples of applications are presented herein that benefit from embodiments of the present invention. Turning to FIG. 2, a read channel 200 is used to process an analog signal 202 and to retrieve user data bits from the analog signal 202 without errors. In some cases, analog signal 202 is derived from a read/write head assembly in a magnetic storage medium. In other cases, analog signal 202 is derived from a receiver circuit that is operable to receive a signal from a transmission medium. The transmission medium may be wireless or wired such as, but not limited to, cable or optical connectivity. Based upon the disclosure provided herein, one of ordinary skill in the art will recognize a variety of sources from which analog signal 202 may be derived.

The read channel 200 includes an analog front end 204 that receives and processes the analog signal 202. Analog front end 204 may include, but is not limited to, an analog filter and an amplifier circuit as are known in the art. Based upon the disclosure provided herein, one of ordinary skill in the art will recognize a variety of circuitry that may be included as part of analog front end 204. In some cases, the gain of a variable gain amplifier included as part of analog front end 204 may be modifiable, and the cutoff frequency and boost of an analog filter included in analog front end 204 may be modifiable. Analog front end 204 receives and processes the analog signal 202, and provides a processed analog signal 206 to an analog to digital converter 210.

Analog to digital converter 210 converts processed analog signal 206 into a corresponding series of digital samples 212. Analog to digital converter 210 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 212 are provided to an equalizer 214. Equalizer 214 applies an equalization algorithm to digital samples 212 to yield an equalized output 216. In some embodiments of the present invention, equalizer 214 is a digital finite impulse response filter circuit as is known in the art. Data or codewords contained in equalized output 216 may be stored in a buffer 218 until a data detector 220 is available for processing.

The data detector 220 performs a data detection process on the received input, resulting in a detected output 222. In some embodiments of the present invention, data detector 220 is a Viterbi algorithm data detector circuit, or more particularly in some cases, a maximum a posteriori (MAP) data detector circuit as is known in the art. In these embodiments, the detected output 222 contains log-likelihood-ratio (LLR) information about the likelihood that each bit or symbol has a particular value. Based upon the disclosure provided herein, one of ordinary skill in the art will recognize a variety of data detectors that may be used in relation to different embodiments of the present invention. Data detector 220 is started based upon availability of a data set in buffer 218 from equalizer 214 or another source.

The detected output 222 from data detector 220 is provided to an interleaver 224 that protects data against burst errors. Burst errors overwrite localized groups or bunches of bits. Because LDPC decoders are best suited to correcting errors that are more uniformly distributed, burst errors can overwhelm LDPC decoders. The interleaver 224 prevents this by interleaving or shuffling the detected output 222 from data detector 220 to yield an interleaved output 226 which is stored in a memory 230. The interleaved output 226 from the memory 230 is provided to a multi-level LDPC layer decoder 232 which performs parity checks on the interleaved output 226, ensuring that parity constraints established by an LDPC encoder (not shown) before storage or transmission are satisfied in order to detect and correct any errors that may have occurred in the data during storage or transmission or during processing by other components of the read channel 200.

Multiple detection and decoding iterations may be performed in the read channel 200, referred to herein as global iterations. (In contrast, local iterations are decoding iterations performed within the LDPC decoder 232.) To perform a global iteration, LLR values 234 from the LDPC decoder 232 are stored in memory 230, deinterleaved in a deinterleaver 236 to reverse the process applied by interleaver 224, and provided again to the data detector 220 to allow the data detector 220 to repeat the data detection process, aided by the LLR values 234 from the LDPC decoder 232. In this manner, the read channel 200 can perform multiple global iterations, allowing the data detector 220 and LDPC decoder 232 to converge on the correct data values.

The LDPC decoder 232 also produces hard decisions 240 about the values of the data bits or symbols contained in the interleaved output 226 of the interleaver 224. For binary data bits, the hard decisions may be represented as 0's and 1's. In a GF(8) LDPC decoder, the hard decisions may be represented by eight field elements 000, 001, 010 . . . 111.

The hard decisions 240 from LDPC decoder 232 are deinterleaved in a hard decision deinterleaver 242, reversing the process applied in interleaver 224, and stored in a hard decision memory 244 before being provided to a user or further processed. For example, the output 246 of the read channel 200 may be further processed to reverse formatting changes applied before storing data in a magnetic storage medium or transmitting the data across a transmission channel.

Turning to FIG. 3, a multi-level LDPC layer decoder 300 is illustrated in block-diagram form in accordance with various embodiments of the present invention. The multi-level LDPC layer decoder 300 generates C2V messages from a check node processor 302 to a variable node processor 304 using min-sum based check node calculations. Incoming LLR values for data to be decoded are received on an input 306 and stored in a Q value memory 310. The memory 310 stores soft LLR input values from the input 306 and Q values of each symbol, representing the likelihood that an input symbol has the value of each element of the Galois Field. For a GF(8) LDPC decoder, the Q values consist of one hard decision and seven soft LLR values, or eight soft LLR values in an equivalent but alternative format.

The memory 310 yields stored Q values 312 or $Q_n(a)$ for the layer previous to the layer currently being processed, also referred to herein as the previous layer and the connected layer. An adder 314 adds the Q values 312 to previous layer C2V messages 316 or $R_{1,n}(a)$ in array fashion to produce S messages 320 or $S_n(a)$ containing total soft LLR values for the previous layer.

The S messages 320 are provided to a normalization and permutation circuit 322, which converts the format of the S messages 320 from eight soft LLR values to the equivalent content but different format of one hard decision and seven soft LLR values (for a GF(8) embodiment), and which applies a permutation to rearrange the variable node updated values to prepare for the check node update and to apply the permutations specified by the non-zero elements of the H matrix. For example, in a GF(4) embodiment, the four elements 0-3 of the Galois Field are 0, 1, $\alpha, \alpha^2$. The permutation applied by normalization and permutation circuit 322 is multiplication in the Galois Field. Element 2 ($\alpha$) multiplied by element 1 (1) equals $\alpha \times 1$ or $\alpha$, which is element 2. Similarly, element $2 \times 2 = \alpha \times \alpha = \alpha^2$, which is element 3. Element $2 \times 3 = \alpha \times \alpha^2 = 1$, which is element 1. Thus, element 2 multiplied by 1, 2 and 3 results in elements 2, 3, and 1, which are permutations of elements 1, 2 and 3. The normalization and permutation circuit 322 yields P messages 324 or $P_n(a)$ for the previous layer. The 322 also yields soft LLR values 326 which are provided to a cyclic shifter 328. Cyclic shifter 328 rearranges the soft LLR values 326 to column order, performs a barrel shift which shifts the normalized soft LLR values 326 from the previous layer to the current layer, and which yields hard decisions 330 or $a_n^*$, calculated as $\text{argmin}_a S_n(a)$.

The P messages 324 from the normalization and permutation circuit 322 are also provided to a shifter 332, a cyclic shifter or barrel shifter which shifts the symbol values in the normalized LLR P messages 324 to generate the next circulant sub-matrix, yielding current level P messages 334 which contain the total soft LLR values of the current layer.

The current level P messages 334 are provided to a subtractor 336 which subtracts the current layer C2V messages 338, or $R_{2,n}(a)$, from the current level P messages 334, yielding D messages 340, or $D_n(a)$.

D messages 340 are provided to a normalization circuit 342 which converts the format of the D messages 340 from eight soft LLR values to the equivalent content but different format of one hard decision and seven soft LLR values, yielding new Q messages 344, or $Q_{2,n}(a)$, also referred to as V2C messages, for the current layer. The Q messages 344 are stored in memory 310, overwriting previous channel or calculated values for the current layer, and are also provided to a scaler 346 which scales the Q messages 344 to yield scaled V2C messages 348, or $T_{2,n}(a)$.

V2C messages 348 are provided to a min finder circuit 350 which calculates the minimum value $\min_1(d)$, second or next minimum value $\min_2(d)$ and the index of the minimum value idx(d). The min finder circuit 350 also calculates the signs of the V2C messages 348 and tracks the sign value of each non-zero element of the H matrix and the cumulative sign for the current layer. The min finder circuit 350 yields the current layer minimum, next minimum and index values with the sign values 352 to a current layer C2V generator 354, which calculates the current layer C2V messages 338, or $R_{2,n}(a)$. The min finder circuit 350 also yields the previous layer minimum, next minimum and index values with the sign values 356 to a previous layer C2V generator 358, which calculates the previous layer C2V messages 316, or $R_{1,n}(a)$. The current layer C2V generator 354 and previous layer C2V generator 358 generate the C2V or R messages 338 and 316 based on the final state and current column index of the symbol. If the current column index is equal to the index of the minimum value, then the value of R is the second minimum value. Otherwise, the value of R is the minimum value of that layer. The sign of R is the XOR of the cumulative sign and the current sign of the symbol.

In summary, the variable node processor 304 and the check node processor 302 operate together to perform layered decoding of non-binary or multi-level data. The variable node processor 304 generates variable node to check node messages (V2C messages) and calculates perceived values based on check node to variable node messages (C2V messages). The check node processor 302 generates C2V messages and calculates checksums based on V2C messages, using a min finder circuit operable to identify a minimum, a next minimum and an index of minimum value in the V2C messages.

Figure 4:
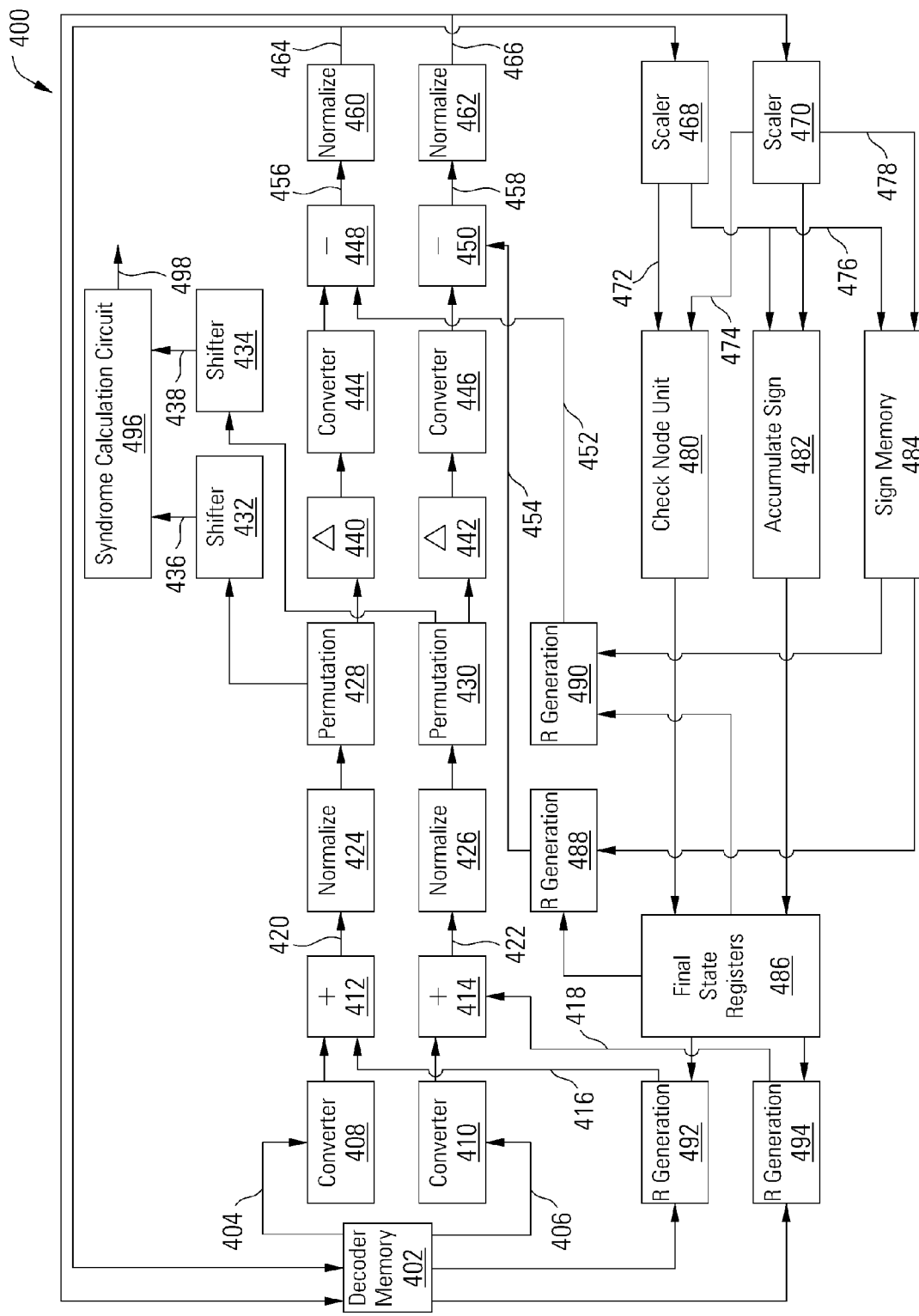
FIG. 4 depicts a block diagram of a multi-level LDPC layer decoder with parallel circulant processing in accordance with various embodiments of the present invention.

Turning to FIG. 4, some embodiments of a multi-level LDPC layer decoder 400 are operable to process two circulants in parallel. A decoder memory 402 in the LDPC layer decoder 600 stores soft LLR input values, Q values, and soft LLR output P values. The decoder memory 402 is a ping pong memory, consisting in some embodiments of 16 banks with each bank having size 54×264. The decoder memory 402 provides Q values 404 and 406 of the connected layer of the variable node to converters 408 and 410, respectively, each based on a different circulant being processed. In a GF(4) embodiment, the Q values 404 and 406 each consist of one hard decision and three soft LLR values.

The converters 408 and 410 convert the Q values from a format containing a hard decision and three soft LLR values to a format containing four soft LLR values, with the information being equivalent in the two formats. Adders 412 and 414 add the connected layer's Q value (converted by converters 408 and 410) to the connected layer's R value 416 and 418 of each symbol of a circulant respectively, yielding the soft LLR values 420 and 422 of each symbol. In an embodiment with GF(4), each adder 412 and 414 consists of four adders each, adapted to add the connected layer's Q value with the connected layer's R value of each symbol of a circulant respectively to obtain the soft LLR values 420 and 422 of each symbol.

The soft LLR values 420 and 422 of each symbol are provided to normalizers 424 and 426, which compare the four values in each of the soft LLR values 420 and 422 to identify the minimum of each, and which subtract that minimum from the other three soft LLR values, thereby normalizing each of the soft LLR values 420 and 422 to their respective minimum.

The normalized variable node LLR values from normalizers 424 and 426 are provided to permutation circuits 428 and 430, which rearrange the variable node updated values to prepare for the check node update and apply the permutations specified by the non-zero elements of the H matrix. Again, in a GF(4) embodiment, the four elements 0-3 of the Galois Field are 0, 1, $\alpha$, $\alpha^2$. The permutation applied by permutation circuits 428 and 430 is multiplication in the Galois Field. Element 2 ($\alpha$) multiplied by element 1 (1) equals $\alpha \times 1$ or $\alpha$, which is element 2. Similarly, element $2 \times 2 = \alpha \times \alpha = \alpha^2$, which is element 3. Element $2 \times 3 = \alpha \times \alpha^2 = 1$, which is element 1. Thus, element 2 multiplied by 1, 2 and 3 results in elements 2, 3, and 1, which are permutations of elements 1, 2 and 3. In the parity check calculation in the LDPC layer decoder 600, each hard decision value is multiplied by the non-zero elements (1, 2, or 3) of the H matrix, and the results are XORed together.

Shifters 432 and 434 process the output of permutation circuits 428 and 430 to shift the soft LLR values back to column order to yield soft LLR outputs 436 and 438, which are provided to a syndrome calculation circuit 496, which generates hard decisions 498 as the output of LDPC layer decoder 600. Soft LLR outputs 436 and 438 may also be used by a parity check calculator (not shown) to determine when data has converged in the LDPC layer decoder 600, as disclosed in U.S. patent application Ser. No. 13/227,416, filed Sep. 7, 2011 for a "Multi-Level LDPC Layer Decoder", which is incorporated herein by reference for all purposes. Shifters 432 and 434 are used to shift from row order to column order because the LDPC layer decoder 600 processes data in row order, but the output total soft LLR is ordered by column in order to subtract the input LLR which is in column order to get the extrinsic LLR value. Delta shifters 440 and 442 also process the output of permutation circuits 428 and 430, shifting the output of the permutation circuits 428 and 430 by the difference in the circulant shift numbers of the current layer and the connected layer. In a given column there are circulants with different shift numbers, and the delta shifters 440 and 442 compensate for the different shift numbers of the current layer and the connected layer.

The output of delta shifters 440 and 442 is provided to converters 444 and 446 which convert from the format containing one hard decision and three soft LLR values back to the format containing four soft LLR values. Subtractors 448 and 450 then subtract the R values 452 and 454 of the symbols of the current layer from the soft LLR P values provided by converters 444 and 446 to obtain Q values 456 and 458 of the symbols of the current layer. The Q values 456 and 458 of the symbols of the current layer are then normalized in normalizers 460 and 462, which compare the four elements in each of the Q values 456 and 458 to identify the minimum of each, and which subtract that minimum from the other three elements of the Q values 456 and 458, thereby normalizing each of the Q values 456 and 458 to their respective minimum. The normalized Q values 464 and 466 are provided to the decoder memory 402 to update the Q values of the current layers, and also to scalers 468 and 470 to obtain the new Q values to perform the check node to variable node update.

Scalers 468 and 470 scale the normalized Q values 464 and 466 from the normalizers 460 and 462, yielding the new Q values 472 and 474, or absolute soft values, along with the Q values signs 476 and 478. The new Q values 472 and 474 and their signs 476 and 478 are provided to the check node unit 480 which finds the minimum value, second or next minimum value (the next larger than the minimum value) and the index of the minimum value. The new Q values signs 476 and 478 are also provided to a sign accumulator 482, which calculates and stores the cumulative sign for the current layer of the Q values 472 and 474, and to a sign memory 484 which stores the sign value of each non-zero element of the H matrix.

Final state registers 486 store the final state consisting of the minimum value, the second minimum value, the index of the minimum value, and cumulative sign of the current layer. These final state values are provided to two sets of R generators 488, 490, 492 and 494, which generate the R value for the connected layer or current layer based on the final state and current column index of the symbol. R generators 488 and 490 generate the R values for the current layer of the two circulants being processed, and R generators 492 and 494 generate the R values for the connected layer of the two circulants being processed. If the current column index is equal to the index of the minimum value, then the value of R is the second minimum value. Otherwise, the value of R is the minimum value of that layer. The sign of R is the XOR of the cumulative sign and the current sign of the symbol.

The various embodiments of the multi-level LDPC layer decoder 300 and 400 provide a hardware-friendly architecture for decoding LDPC codes over large or small Galois fields.

Figure 5:
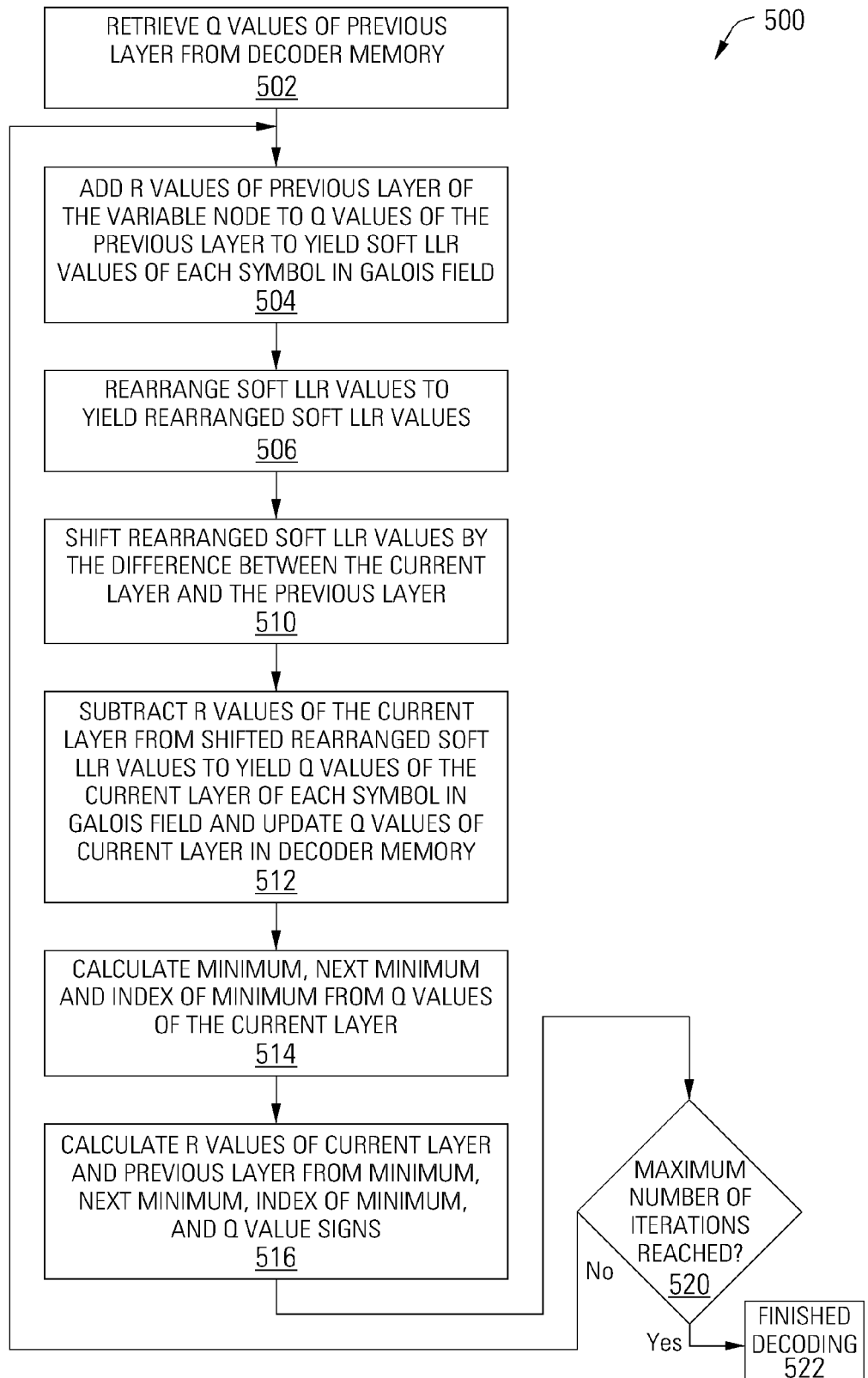
FIG. 5 depicts a flow diagram showing a method for multi-level layered LDPC decoding in accordance with various embodiments of the present invention.

Turning to FIG. 5, a flow diagram 500 depicts a method for layered multi-level LDPC decoding in accordance with various embodiments of the present invention. The method of FIG. 5, or variations thereof, may be performed in data decoding circuits such as those illustrated in FIGS. 3-4. Following flow diagram 500, the Q values of the previous layer of the H matrix are retrieved from the decoder memory. (Block 502) R values of the previous layer of the variable node are added to Q values of the previous layer to yield soft LLR values of each symbol in Galois Field. (Block 504) The soft LLR values are rearranged to yield rearranged soft LLR values. (Block 506) The rearranged soft LLR values are shifted by the difference between the current layer and the previous layer. (Block 510) R values of the current layer are subtracted from the shifted rearranged soft LLR values to yield Q values of the current layer of each symbol in Galois Field, and Q values of current layer are updated in the decoder memory. (Block 512) The minimum, next minimum and index of minimum are calculated from Q values of the current layer. (Block 514) R values of the current layer and the previous layer are calculated from the minimum, next minimum, index of minimum, and Q value signs. (Block 516) If the current column index is equal to the index of the minimum value, then the value of R is the second minimum value. Otherwise, the value of R is the minimum value of that layer. The sign of R is the XOR of the cumulative sign and the current sign of the symbol.

A determination is made as to whether the maximum number of iterations has been reached in the decoder. (Block 520) If so, decoding is finished. (Block 522) If not, decoding continues at block 504.

Figure 6:
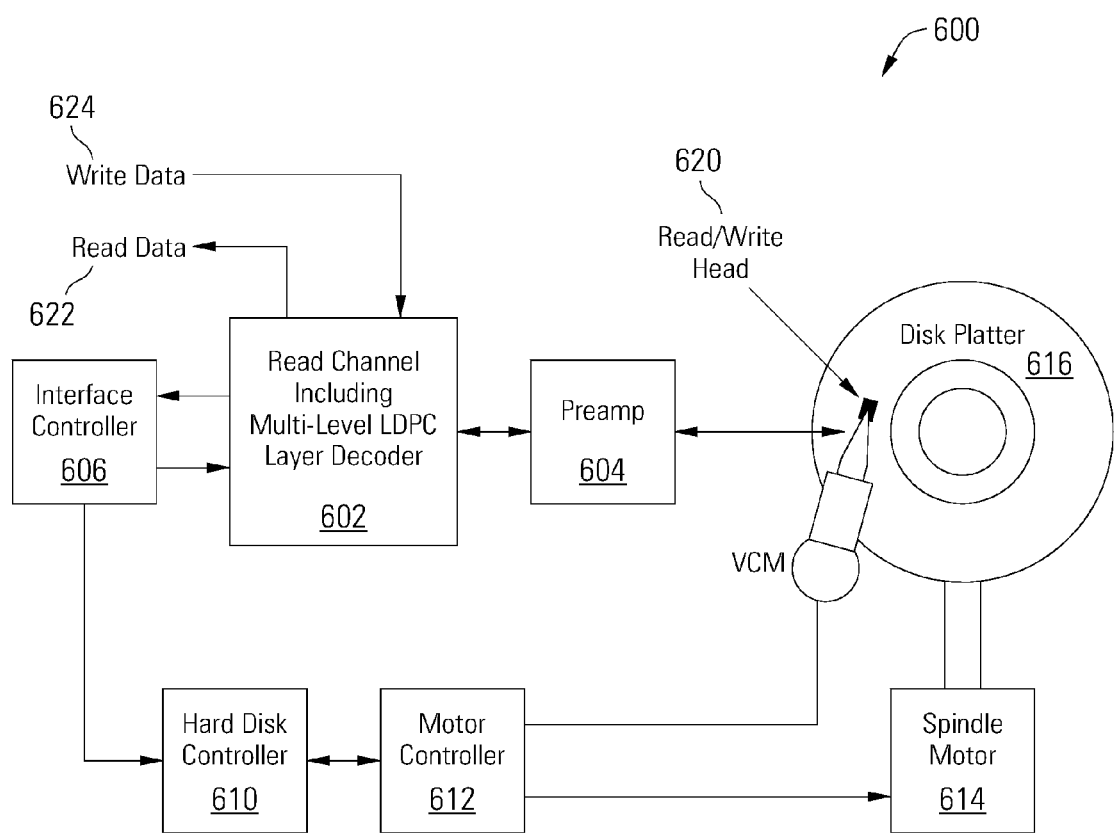
FIG. 6 depicts a storage system including a multi-level LDPC layer decoder in accordance with some embodiments of the present invention.

Although the multi-level LDPC layer decoder disclosed herein is not limited to any particular application, several examples of applications are presented herein that benefit from embodiments of the present invention. FIG. 6 shows a storage system 600 including a read channel circuit 602 with a multi-level LDPC layer decoder in accordance with some embodiments of the present invention. Storage system 600 may be, for example, a hard disk drive. Storage system 600 also includes a preamplifier 604, an interface controller 606, a hard disk controller 610, a motor controller 612, a spindle motor 614, a disk platter 616, and a read/write head assembly 620. Interface controller 606 controls addressing and timing of data to/from disk platter 616. The data on disk platter 616 consists of groups of magnetic signals that may be detected by read/write head assembly 620 when the assembly is properly positioned over disk platter 616. In one embodiment, disk platter 616 includes magnetic signals recorded in accordance with either a longitudinal or a perpendicular recording scheme.

In a typical read operation, read/write head assembly 620 is accurately positioned by motor controller 612 over a desired data track on disk platter 616. Motor controller 612 both positions read/write head assembly 620 in relation to disk platter 616 and drives spindle motor 614 by moving read/write head assembly 620 to the proper data track on disk platter 616 under the direction of hard disk controller 610. Spindle motor 614 spins disk platter 616 at a determined spin rate (RPMs). Once read/write head assembly 620 is positioned adjacent the proper data track, magnetic signals representing data on disk platter 616 are sensed by read/write head assembly 620 as disk platter 616 is rotated by spindle motor 614. The sensed magnetic signals are provided as a continuous, minute analog signal representative of the magnetic data on disk platter 616. This minute analog signal is transferred from read/write head assembly 620 to read channel circuit 602 via preamplifier 604. Preamplifier 604 is operable to amplify the minute analog signals accessed from disk platter 616. In turn, read channel circuit 602 decodes and digitizes the received analog signal to recreate the information originally written to disk platter 616. This data is provided as read data 622 to a receiving circuit. As part of decoding the received information, read channel circuit 602 processes the received signal using a multi-level LDPC layer decoder. Such a multi-level LDPC layer decoder may be implemented consistent with that disclosed above in relation to FIGS. 3-4. In some cases, the multi-level layered LDPC decoding may be done consistent with the flow diagram disclosed above in relation to FIG. 5. A write operation is substantially the opposite of the preceding read operation with write data 624 being provided to read channel circuit 602. This data is then encoded and written to disk platter 616. It should be noted that various functions or blocks of storage system 600 may be implemented in either software or firmware, while other functions or blocks are implemented in hardware.

Figure 7:
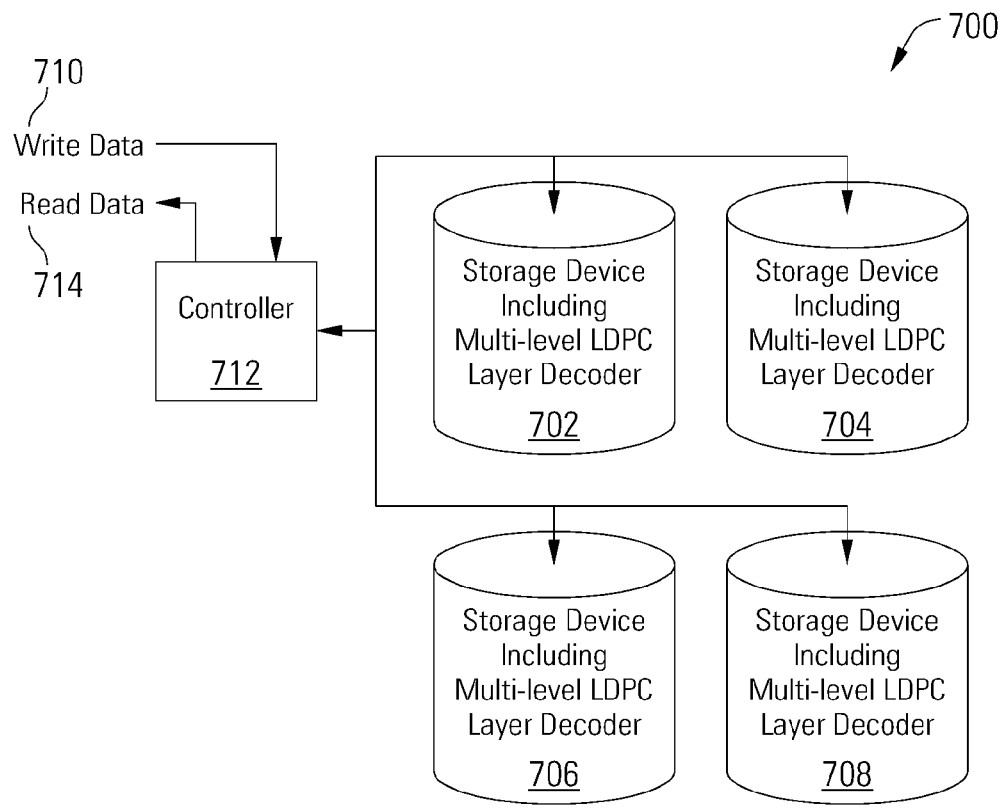
FIG. 7 depicts a virtual storage system including a multi-level LDPC layer decoder in accordance with some embodiments of the present invention.

Turning to FIG. 7, a multi-level LDPC layer decoder as disclosed above in relation to FIGS. 3-4 may be integrated into a virtual storage system such as a RAID (redundant array of inexpensive disks or redundant array of independent disks) based storage system 700 that increases stability and reliability through redundancy, combining multiple disks as a logical unit. Data may be spread across a number of disks 702, 704, 706, 708 included in the RAID storage system 700 according to a variety of algorithms and accessed by an operating system as if it were a single disk. For example, data may be mirrored to multiple disks 702-708 in the RAID storage system 700, or may be sliced and distributed across multiple disks 702-708 in a number of techniques. If a small number of disks (e.g., 702) in the RAID storage system 700 fail or become unavailable, error correction techniques may be used to recreate the missing data based on the remaining portions of the data from the other disks (e.g., 704-708) in the RAID storage system 700. The disks 702-708 in the RAID storage system 700 may be, but are not limited to, individual storage systems such as that disclosed above in relation to FIG. 6, and may be located in close proximity to each other or distributed more widely for increased security. In a write operation, write data 710 is provided to a controller 712, which stores the write data 710 across the disks 702-708, for example by mirroring or by striping the write data 710. In a read operation, the controller 712 retrieves the data from the disks 702-708, performing error correction using variable sector size LDPC decoding in either or both the controller 712 and the disks 702-708 and recreating any missing data where possible. The controller 712 then yields the resulting read data 714 as if the RAID storage system 700 were a single disk.

Figure 8:
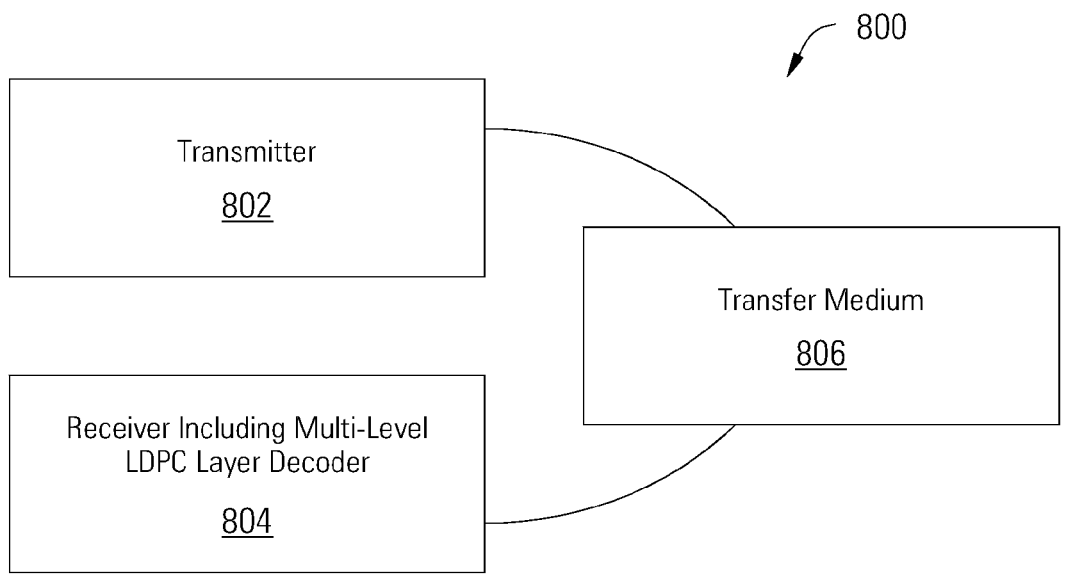
FIG. 8 depicts an example data transmission device including a multi-level LDPC layer decoder in accordance with some embodiments of the present invention.

Turning to FIG. 8, a wireless communication system 800 or data transmission device including a receiver 804 with a multi-level LDPC layer decoder is shown in accordance with some embodiments of the present invention. Communication system 800 includes a transmitter 802 that is operable to transmit encoded information via a transfer medium 806 as is known in the art. The encoded data is received from transfer medium 806 by receiver 804. Receiver 804 incorporates a multi-level LDPC layer decoder. Such a multi-level LDPC layer decoder may be implemented consistent with that disclosed above in relation to FIGS. 3-4. In some cases, the decoding may be done consistent with the flow diagram disclosed above in FIG. 5.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel methods and apparatuses for layered multi-level LDPC decoding. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An apparatus for multi-level layered low density parity check decoding comprising:
    a variable node processor, wherein the variable node processor is operable to generate variable node to check node messages and to calculate perceived values based on check node to variable node messages; and
    a check node processor, wherein the check node processor is operable to generate the check node to variable node messages and to calculate checksums based on variable node to check node messages, the check node processor comprising a min finder circuit operable to identify a minimum, a next minimum and an index of minimum value in the variable node to check node messages, wherein the variable node processor and check node processor are operable to perform layered multi-level decoding.

2. The apparatus of claim 1, wherein the variable node processor comprises an adder operable to add Q values to previous layer check node to variable messages for a previous layer to yield total soft log likelihood ratio values for the previous layer.

3. The apparatus of claim 1, wherein the variable node processor comprises a normalization circuit operable to convert a message between a first format comprising a hard decision and a plurality of log likelihood ratio values and a second format comprises a second plurality of log likelihood ratio values, wherein the second format has a greater number of the log likelihood ratio values than the first format.

4. The apparatus of claim 1, wherein the variable node processor comprises a shifter operable to shift total soft log likelihood ratio messages from a previous layer to a current layer.

5. The apparatus of claim 4, wherein the previous layer and the current layer comprise circulants.

6. The apparatus of claim 1, further comprising a shifter circuit operable to rearrange total soft log likelihood ratio messages to yield column ordered total soft log likelihood ratio messages.

7. The apparatus of claim 6, wherein the shifter circuit is operable to shift the column ordered total soft log likelihood ratio messages from a previous layer to a current layer and to generate a hard decision.

8. The apparatus of claim 1, wherein the variable node processor comprises a subtractor operable to subtract a current layer check node to variable node message from a current layer total soft log likelihood ratio message.

9. The apparatus of claim 8, wherein the variable node processor further comprises a normalization circuit operable to convert a format of an output of the subtractor.

10. The apparatus of claim 1, wherein the check node processor further comprises a scaler operable to scale the variable node to check node messages.

11. The apparatus of claim 1, wherein the check node processor comprises a current layer message generator operable to generate a current layer check node to variable node message from an output of the min finder circuit.

12. The apparatus of claim 1, wherein the check node processor comprises a previous layer message generator operable to generate a previous layer check node to variable node message from an output of the min finder circuit.

13. The apparatus of claim 1, wherein the variable node processor and the check node processor are operable to process a plurality of circulant sub-matrices of an H matrix in parallel.

14. The apparatus of claim 1, wherein the variable node comprises:
- an adder operable to add Q values to a previous layer check node to variable message for a previous layer to yield total soft log likelihood ratio values for the previous layer;
- a normalization circuit operable to convert the total soft log likelihood ratio values for the previous layer between a first format comprising a hard decision and a plurality of log likelihood ratio values and a second format comprises a second plurality of log likelihood ratio values to yield P messages for the previous layer, wherein the second format has a greater number of the log likelihood ratio values than the first format;
- a shifter operable to shift the P messages from the previous layer to a current layer;
- a subtractor operable to subtract a current layer check node to variable node message from the P messages for the current layer to yield D messages for the current layer; and
- a second normalization circuit operable to convert the D messages for the current layer from the second format to the first format to yield the variable node to check node messages; and
- wherein the check node processor further comprises:
- a current layer message generator operable to generate the current layer check node to variable node message from an output of the min finder circuit; and
- a previous layer message generator operable to generate the previous layer check node to variable node message from an output of the min finder circuit.

15. The apparatus of claim 1, wherein the apparatus is implemented as an integrated circuit.

16. The apparatus of claim 1, wherein the apparatus is incorporated in a storage device.

17. The apparatus of claim 1, wherein the apparatus is incorporated in a storage system comprising a redundant array of independent disks.

18. The apparatus of claim 1, wherein the apparatus is incorporated in a data transmission device.

19. A storage system comprising:
- a storage medium maintaining a data set;
- a write head operable to magnetically record the data set to the storage medium; and
- a multi-level low density parity check layer decoder comprising:
  - a variable node processor, wherein the variable node processor is operable to generate variable node to check node messages and to calculate perceived values based on check node to variable node messages; and
  - a check node processor, wherein the check node processor is operable to generate the check node to variable node messages and to calculate checksums based on variable node to check node messages, the check node processor comprising a min finder circuit operable to identify a minimum, a next minimum and an index of minimum value in the variable node to check node messages.

20. A method of decoding data in a multi-level low density parity check layer decoder, comprising:
- in a variable node processor, generating variable node to check node messages and calculating perceived values based on check node to variable node messages; and
- in a check node processor, generating the check node to variable node messages and calculating checksums based on the variable node to check node messages, the check node processor comprising a min finder circuit operable to identify a minimum, a next minimum and an index of minimum value in the variable node to check node messages, wherein the variable node processor and check node processor are operable to perform layered multi-level decoding.

* * * * *